United States Patent
Qian et al.

(10) Patent No.: US 12,010,804 B2
(45) Date of Patent: Jun. 11, 2024

(54) POWER RECEPTACLE

(71) Applicant: Chengli Li, Suzhou (CN)

(72) Inventors: Lei Qian, Suzhou (CN); Xiaoliang Bao, Suzhou (CN)

(73) Assignee: Chengli Li, Suzhou (CN)

( * ) Notice: Subject to any disclaimer, the term of this patent is extended or adjusted under 35 U.S.C. 154(b) by 155 days.

(21) Appl. No.: 17/808,953

(22) Filed: Jun. 24, 2022

(65) Prior Publication Data

US 2023/0389199 A1 Nov. 30, 2023

(30) Foreign Application Priority Data

May 25, 2022 (CN) .......................... 202210577324.6
May 25, 2022 (CN) .......................... 202221274418.8

(51) Int. Cl.
*H05K 5/02* (2006.01)
*H05K 5/03* (2006.01)

(52) U.S. Cl.
CPC ............. *H05K 5/0213* (2013.01); *H05K 5/03* (2013.01)

(58) Field of Classification Search
None
See application file for complete search history.

(56) References Cited

U.S. PATENT DOCUMENTS

| | | | |
|---|---|---|---|
| 6,875,937 B1* | 4/2005 | Saviano | H02G 3/123 200/267 |
| 6,942,395 B1* | 9/2005 | Chuan | G02B 6/4278 385/53 |
| 8,395,884 B1* | 3/2013 | Czarnecki | H02B 1/48 361/644 |
| 9,099,846 B2* | 8/2015 | McKay | H02B 1/04 |
| 10,398,050 B2* | 8/2019 | Tracy | H05K 7/2039 |
| 2006/0029332 A1* | 2/2006 | Chiu | G02B 6/4246 385/53 |
| 2010/0290163 A1* | 11/2010 | Li | H01H 83/04 361/42 |
| 2013/0040489 A1* | 2/2013 | Fang | H01R 25/006 439/536 |
| 2015/0016027 A1* | 1/2015 | Leahy | H02B 1/52 361/625 |
| 2018/0116063 A1* | 4/2018 | Tracy | H05K 7/02 |
| 2020/0356148 A1* | 11/2020 | Degner | G06F 1/182 |

* cited by examiner

*Primary Examiner* — Xanthia C Relford
(74) *Attorney, Agent, or Firm* — Chen Yoshimura LLP

(57) ABSTRACT

A power receptacle for supplying power to a plug inserted therein includes a shell, which includes a cover assembly having at least one socket on its exterior adapted to receive the plug, and a base cooperating with and coupled to the cover assembly; an electrical connection assembly, disposed within the shell, and configured to electrically connect to the plug which is inserted into the socket; a PCB (printed circuit board) assembly, disposed within the shell, including a power processing circuit, and electrically coupled to the electrical connection assembly; and a grounding frame, formed of metal, and partially disposed between the electrical connection assembly and the PCB assembly. The structure improves heat dissipation from interior components of the receptacle and its electromagnetic compatibility.

10 Claims, 2 Drawing Sheets

POWER RECEPTACLE

BACKGROUND OF THE INVENTION

This invention relates to electrical devices, and in particular, it relates to a power receptacle.

Electrical devices and appliances are rapidly advancing, and many electrical devices and appliances are requiring increased battery capacity and power consumption. Requirements of power supply capacities of power receptacles are increasing accordingly. Heat generation by high power wall-mount receptacles is often a problem, as heat dissipation is limited by the receptacles' sizes that are specified by industry or government standards. Some conventional power receptacles use thermal-conductive potting silica gel, which spreads the heat to components in the entire receptacle, in order to improve heat dissipation. However, such techniques require high manufacturing cost. There is a need for power receptacles with superior heat dissipation and lower cost.

SUMMARY OF THE INVENTION

To solve the above problems, the present invention provides a power receptacle with improved heat dissipation, which can maintain relatively low interior temperature under high power operation.

Embodiments of the present invention provide a power receptacle for supplying power to a plug inserted therein, which includes: a shell, including: a cover assembly, having at least one socket on its exterior adapted to receive the plug; and a base, configured to cooperate with and be coupled to the cover assembly; an electrical connection assembly, disposed within the shell, and configured to electrically connect to the plug which is inserted into the socket; a PCB (printed circuit board) assembly, disposed within the shell, including a power processing circuit, and electrically coupled to the electrical connection assembly; and a grounding frame, formed of metal, and partially disposed between the electrical connection assembly and the PCB assembly.

In such a receptacle, by employing the grounding frame between the electrical connection assembly and the PCB assembly, heat dissipation from the electrical connection assembly and PCB assembly is improved, which reduces the temperature of internal components of the receptacle. It also reduces the amount of heat flow from the PCB assembly where it is generated to the electrical connection assembly. Further, the grounding frame provides an electromagnetic shielding effect for the PCB assembly, which enhances the electromagnetic compatibility of the receptacle.

In some embodiments, the power receptacle further includes an electrical insulating sheet, disposed between the grounding frame and the PCB assembly.

In some embodiments, the power receptacle further includes an electrically-insulating heat conducting pad, disposed between the electrical insulating sheet and the PCB assembly.

In some embodiments, the grounding frame includes an arm located at a periphery of the grounding frame, wherein the arm is affixed to the shell, wherein the shell includes a plurality of through holes on its exterior surface located in a vicinity of the arm, configured to dissipate heat from the arm.

In some embodiments, the arm is affixed to the cover assembly, and the plurality of through holes are located on an exterior of the cover assembly.

In some embodiments, the cover assembly includes: an exterior cover frame and an interior cover frame cooperating with each other, the interior cover frame being affixed to an inside of the exterior cover frame, the exterior cover frame and interior cover frame defining respective openings; a faceplate defining the socket, the faceplate being inserted through the openings of the exterior cover frame and the interior cover frame whereby the socket on the faceplate is exposed; wherein the arm of the grounding frame is affixed to the interior cover frame, and the through holes are located on the exterior cover frame.

In some embodiments, the interior cover frame is formed of a metal.

In some embodiments, the interior cover frame includes a plurality of grooves.

In some embodiments, the grooves extend on an upper surface of the interior cover frame, and their cross sections in a direction perpendicular to the grooves are at least partly aligned with the through holes, wherein the projection of the cross sections along an extending direction of the grooves on the exterior cover frame at least partly overlap with the through holes, whereby the grooves and the through holes form passages configured to allow heat dissipation from the interior cover frame via the through holes.

In some embodiments, positions of the through holes on the exterior cover frame correspond to a top of the interior cover frame.

BRIEF DESCRIPTION OF DRAWINGS

Preferred embodiments of the present invention are described with reference to the drawings.

DETAILED DESCRIPTION OF THE INVENTION

Preferred embodiments of the present and their applications are described below. It should be understood that these descriptions describe embodiments of the present invention but do not limit the scope of the invention. When describing the various components, directional terms such as "left," "right," "up," "down," "top," "bottom" etc. are not absolute but are relative. These terms may correspond to the views in the various illustrations, and can change when the views or the relative positions of the components change.

The invention described here can be implemented in any types of power receptacles. The descriptions below use a high-power USB (Universal Serial Bus) charging receptacle as an example.

Figure 1:
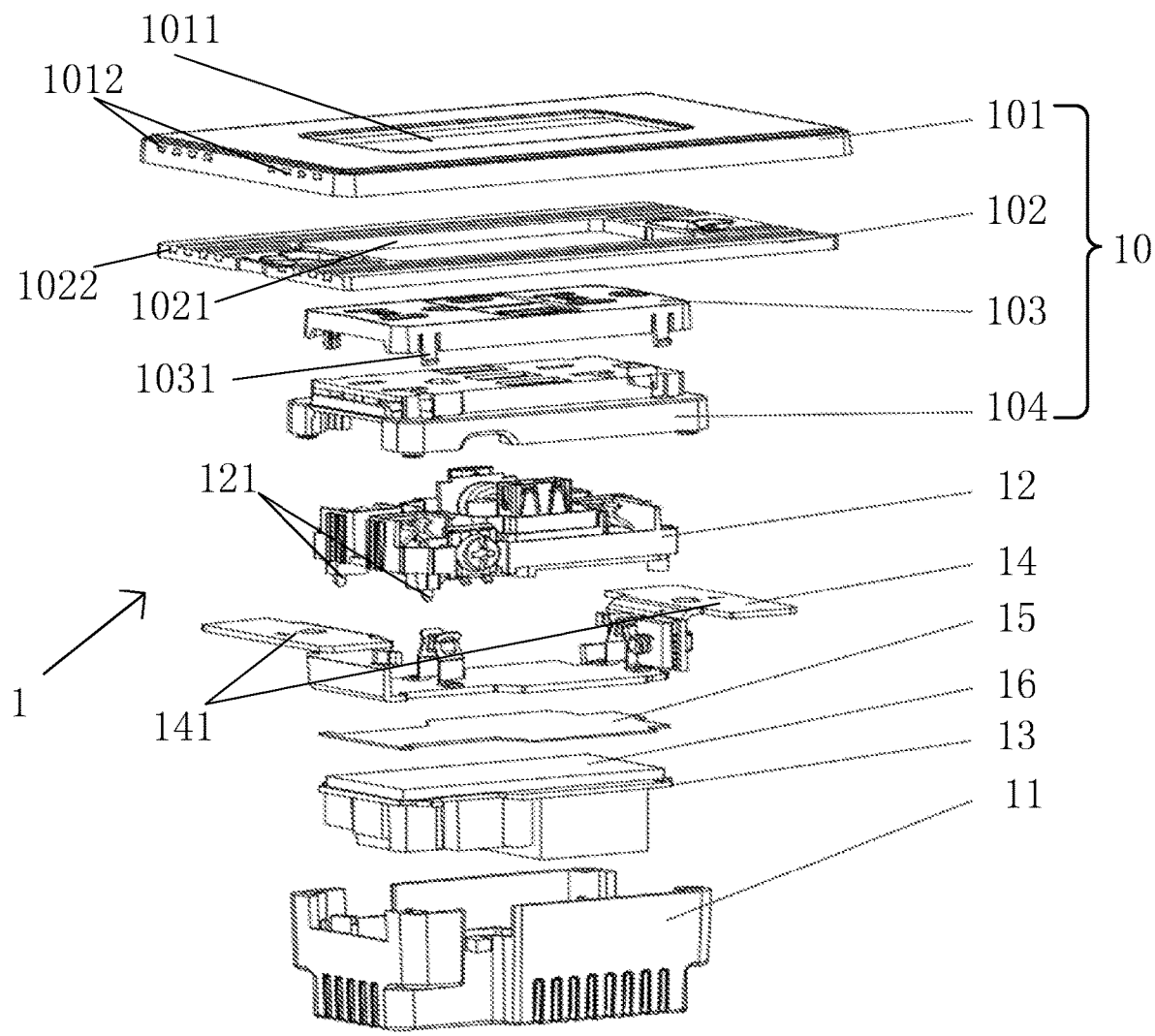
FIG. 1 is an exploded view of a power receptacle according to an embodiment of the present invention.

FIG. 1 is an exploded view of a high-power USB charging receptacle 1 according to an embodiment of the present invention. The receptacle 1, which functions to supply power to electrical device plugged into it, is formed of a shell and components disposed inside the shell. The shell includes a cover assembly 10 and a base 11, which cooperate with each other and are coupled to each other. The cover assembly 10 defines charging sockets such as USB ports on its exterior, adapted for receiving corresponding plugs of electrical devices, to supply power to the electrical devices or to charge them.

The cover assembly 10 includes an exterior cover frame 101, an interior cover frame 102, an exterior faceplate 103, and an interior faceplate 104. The exterior cover frame 101 and interior cover frame 102 cooperate with each other, and the interior cover frame 102 is affixed to the inside (underside) of the exterior cover frame 101 by snaps. The exterior faceplate 103 is affixed to the interior faceplate 104 by multiple snaps 1031. The exterior faceplate 103 and interior faceplate 104 may be collectively referred to as the faceplate, which has a number of socket holes for receiving USB plugs. The exterior cover frame 101 and interior cover frame 102 have respective openings 1011 and 1021, and the faceplate is inserted through the openings 1011, 1021 facing up, such that the sockets on the faceplate are exposed.

The internal components of the receptacle 1 include an electrical connection assembly 12, a PCB (printed circuit board) assembly 13, and a grounding frame 14. The electrical connection assembly 12 is disposed inside the shell, and include USB ports having electrical contact terminals. When an USB plug is inserted into a USB port through the faceplate, the contact pins of the USB plug is electrically connected to the contact terminals of the USB port, thereby electrically coupling the USB plug and the receptacle 1.

The PCB assembly 13 includes a PCB with electrical components mounted thereon, and is disposed in the shell. The PCB assembly 13 includes a power processing module such as a power converter circuit, which converts an input AC power (e.g., 125V, 220V, etc.) to a low voltage DC power for supplying the USB ports. The PCB assembly 13 is electrically coupled to the electrical connection assembly 12. The AC power lines are coupled to the receptacle via screws on the electrical connection assembly 12, and then coupled to the PCB assembly 13 via two terminals 121 located below the electrical connection assembly 12 to couple the AC power to the PCB assembly 13. In the PCB assembly 13, the power converter circuit converts the AC power to a low voltage DC power to be supplied to the USB ports. The low voltage DC power is coupled from the PCB assembly 13 to the electrical connection assembly 12 by electrical lines (not shown in FIG. 1). The USB ports of the electrical connection assembly 12 receive the USB plug to supply the low voltage DC power to the USB plug.

The grounding frame 14 of the receptacle 1 is formed of metal and partly disposed between the electrical connection assembly 12 and the PCB assembly 13, and functions to ground the internal components of the receptacle 1. When the receptacle 1 is normally supplying power to the electrical devices plugged into the receptacle, both the electrical connection assembly 12 and the PCB assembly 13 will generate heat, and the temperature of the PCB assembly 13 is typically higher than that of the electrical connection assembly 12. The grounding frame 14, which has a relatively large area, can help heat dissipation from the electrical connection assembly 12 and the PCB assembly 13, thereby lowering their temperature. The grounding frame 14 can also reduce the amount of heat transferred from the PCB assembly 13 to the electrical connection assembly 12, i.e., it has a certain degree of heat insulating effect. Further, the grounding frame 14, which is disposed above the PCB assembly 13, also has an electromagnetic shielding effect for the PCB assembly 13, which enhances the electromagnetic compatibility of the receptacle 1 with other devices.

The receptacle 1 further includes an electrical insulating sheet 15, such as a mylar sheet, disposed between the grounding frame 14 and the PCB assembly 13. The electrical insulating sheet 15 electrically insulates the PCB assembly 13 from the grounding frame 14, preventing electrical components on the PCB assembly 13 shorting to the grounding frame 14. This helps the receptacle 1 meet electrical safety requirements. A part of the heat generated by the PCB assembly 13 is conducted through the electrical insulating sheet 15 to the grounding frame 14.

The receptacle 1 further includes an electrically-insulating heat conducting pad 16, disposed between the electrical insulating sheet 15 and the PCB assembly 13, for conducting the heat generated by the PCB assembly 13. The heat conducting pad 16 may be a heat-conducting silica gel pad, or a heat-conducting adhesive that has been solidified. The heat conducting pad 16 tightly sticks to the surface of the circuit board of PCB assembly 13, filling voids on the surface of the circuit board, to conduct heat away from the PCB assembly 13.

To securely mount the grounding frame 14 in the receptacle 1, the grounding frame 14 includes two arms 141 located in the periphery (e.g. the two ends) of the grounding frame 14, the two arms being affixed to the cover assembly 10. The cover assembly 10 has a number of through holes on its outer surface. The heat is conducted through the grounding frame 14 to the arms 141, then through the corresponding regions of the cover assembly that are coupled to the arms 141, and eventually dissipated via the through holes by air circulation.

Figure 2:
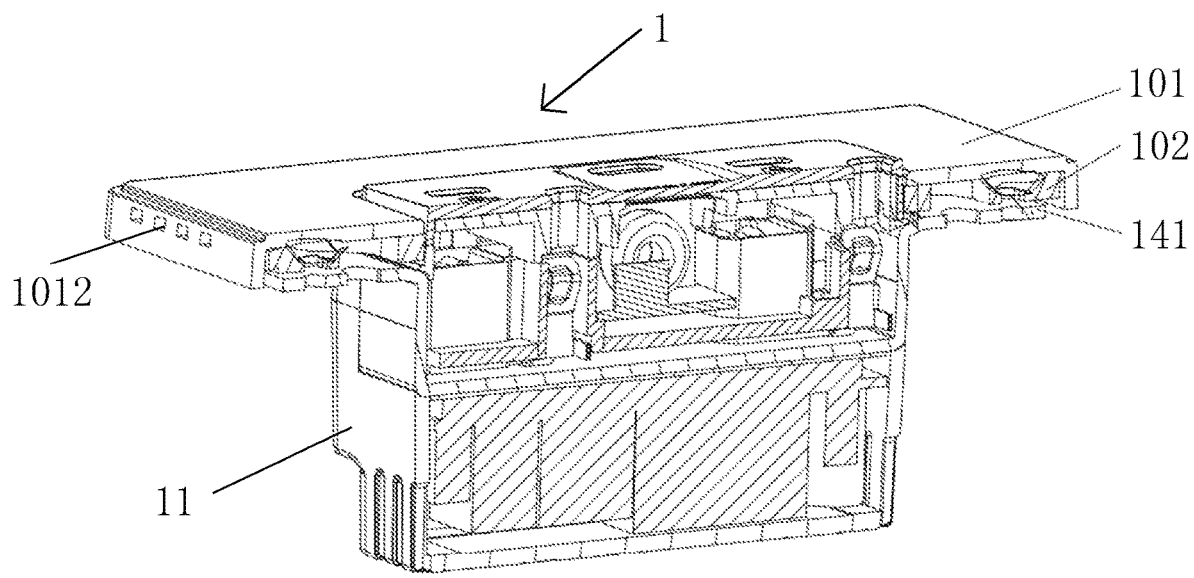
FIG. 2 is a cut-away view of the assembled power receptacle of FIG. 1.

More specifically, the two arms 141 of the grounding frame 14 are affixed (e.g. by screws or rivets) to the interior cover frame 102. The exterior cover frame 101 is provided with multiple through holes 1012 on its two side surfaces. FIG. 2 illustrates the assembled power receptacle in a cut-away view. When the receptacle 1 is installed in the wall or a receptacle box, the exterior cover frame 101 is exposed to the air, and the through holes 1012 on the cover assembly 10 help to dissipate heat from the grounding frame 14. Although in this embodiment, the arms 141 of the grounding frame 14 are affixed to the cover assembly 10, the arms 141 may alternatively be affixed to other parts of the shell. By providing the multiple through holes on the shell in a vicinity of the arms 141, heat can be effectively dissipated from the grounding frame 14. For example, the arms 141 of the grounding frame 14 may be affixed to the base 11, and the base 11 may be provided with multiple heat dissipation through holes, so that heat can be dissipated from the grounding frame 14 and the PCB assembly 13 via the heat dissipation through holes to the wall or the space in the receptacle box.

Figure 3:
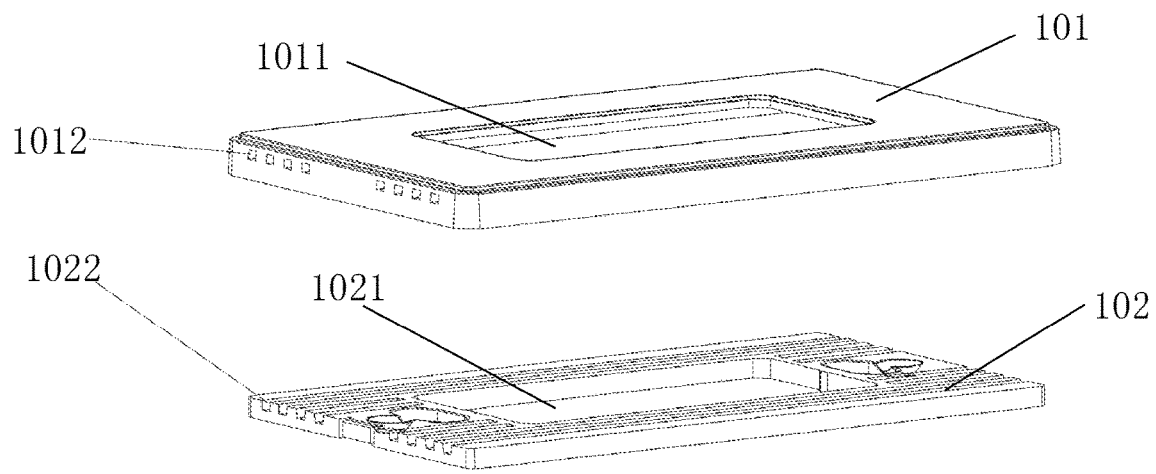
FIG. 3 illustrates the cover frames of the power receptacle of FIG. 1.

As described above, heat is conducted by the grounding frame 14 to its two arms 141, and conducted through the interior cover frame 102, then dissipated via the through holes 1012 of the exterior cover frame 101 by air circulation. The interior cover frame 102 may be formed of a metal or plastic; preferably, metal is used, which facilitates heat conduction. The interior cover frame 102 may further be provided with multiple grooves 1022, e.g., on its upper side, to increase heat dissipation surface within the limited space for better heat dissipation. Referring to FIGS. 2 and 3, the grooves 1022 extend on the upper surface of the interior cover frame 102, and their cross sections in the direction perpendicular to the grooves are at least partly aligned with the through holes 1012, i.e., the projection of the cross sections, along the extending direction of the grooves 1022, on the exterior cover frame 101 at least partly overlap with the through holes 1012; thus, the grooves 1022 and through holes 1012 form passages, to allow heat of the interior cover frame 102 to partly dissipate via the through holes 1012. The shape of the through holes 1012 and the cross-sectional shape of the grooves 1022 include, without limitation, square, circle, trapezoid, and other shapes including irregular shapes.

Further, after the exterior cover frame 101 and interior cover frame 102 are assembled together, the positions of the through holes 1012 on the exterior cover frame 101 correspond to the top of the interior cover frame 102. If the user inadvertently inserts needle-shaped metal objects into the receptacle 1 through the through holes 1012 of the exterior cover frame 101, the objects will be confined to the space enclosed by the exterior cover frame 101, the interior cover frame 102, and the faceplate, and cannot enter the interior space of the receptacle 1 where electrical components are disposed. This prevents electrical shock and other harm to users.

When assembling the components of the receptacle 1, the exterior faceplate 103 and interior faceplate 104 are joined together by the snaps, and the following components are sequentially placed inside the base 11 as shown in FIG. 1: the PCB assembly 13 covered with the heat conducting pad 16, the electrical insulating sheet 15, the grounding frame 14, the electrical connection assembly 12, and the faceplate. Then, the interior faceplate 104 is affixed to the base 11, e.g., by multiple screws that pass through the screw holes of the base 11 and screw into the interior faceplate 104. This secures the above components into one assembly. After the arms 141 of the grounding frame 14 are affixed to the interior cover frame 102, the interior cover frame 102 is affixed to the exterior cover frame 101 by snaps. This completes the assembling of the receptacle 1. During this assembling process, the various adjoining components should contact each other as tightly as possible, to avoid air gaps and to achieve optimum heat dissipation effect.

While the present invention is described above using specific examples, these examples are only illustrative and do not limit the scope of the invention. It will be apparent to those skilled in the art that various modifications, additions and deletions can be made to the power receptacles of the present invention without departing from the spirit or scope of the invention.

The invention claimed is:

1. A power receptacle for supplying power to a plug inserted therein, comprising:
   a shell, including:
      a cover assembly, having at least one socket on its exterior adapted to receive the plug; and
      a base, configured to cooperate with and be coupled to the cover assembly;
   an electrical connection assembly, disposed within the shell, and configured to electrically connect to the plug which is inserted into the socket;
   a PCB (printed circuit board) assembly, disposed within the shell, including a power processing circuit, and electrically coupled to the electrical connection assembly; and
   a grounding frame, formed of metal, and partially disposed between the electrical connection assembly and the PCB assembly.

2. The power receptacle of claim 1, further comprising an electrical insulating sheet, disposed between the grounding frame and the PCB assembly.

3. The power receptacle of claim 2, further comprising an electrically-insulating heat conducting pad, disposed between the electrical insulating sheet and the PCB assembly.

4. The power receptacle of claim 1, wherein the grounding frame includes an arm located at a periphery of the grounding frame, wherein the arm is affixed to the shell, wherein the shell includes a plurality of through holes on its exterior surface located in a vicinity of the arm, configured to dissipate heat from the arm.

5. The power receptacle of claim 4, wherein the arm is affixed to the cover assembly, and wherein the plurality of through holes are located on an exterior of the cover assembly.

6. The power receptacle of claim 5, wherein the cover assembly includes:
   an exterior cover frame and an interior cover frame cooperating with each other, the interior cover frame being affixed to an inside of the exterior cover frame, the exterior cover frame and interior cover frame defining respective openings;
   a faceplate defining the socket, the faceplate being inserted through the openings of the exterior cover frame and the interior cover frame whereby the socket on the faceplate is exposed;
   wherein the arm of the grounding frame is affixed to the interior cover frame, and the through holes are located on the exterior cover frame.

7. The power receptacle of claim 6, wherein the interior cover frame is formed of a metal.

8. The power receptacle of claim 6, wherein the interior cover frame includes a plurality of grooves.

9. The power receptacle of claim 8, wherein the grooves extend on an upper surface of the interior cover frame, and their cross sections in a direction perpendicular to the grooves are at least partly aligned with the through holes, wherein the projection of the cross sections along an extending direction of the grooves on the exterior cover frame at least partly overlap with the through holes, whereby the grooves and the through holes form passages configured to allow heat dissipation from the interior cover frame via the through holes.

10. The power receptacle of claim 6, wherein positions of the through holes on the exterior cover frame correspond to a top of the interior cover frame.

* * * * *